United States Patent
Okada et al.

(10) Patent No.: US 9,804,422 B2
(45) Date of Patent: Oct. 31, 2017

(54) SEMICONDUCTOR OPTICAL MODULATION DEVICE

(71) Applicant: Mitsubishi Electric Corporation, Tokyo (JP)

(72) Inventors: Norio Okada, Tokyo (JP); Tatsuki Otani, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 382 days.

(21) Appl. No.: 14/584,457

(22) Filed: Dec. 29, 2014

(65) Prior Publication Data
US 2015/0261016 A1 Sep. 17, 2015

(30) Foreign Application Priority Data

Mar. 14, 2014 (JP) ................................ 2014-051965

(51) Int. Cl.
*H04B 10/00* (2013.01)
*H04B 10/12* (2006.01)
(Continued)

(52) U.S. Cl.
CPC ............ *G02F 1/0121* (2013.01); *G02F 1/015* (2013.01); *G02F 1/01* (2013.01); *G02F 2202/10* (2013.01);
(Continued)

(58) Field of Classification Search
CPC ...... H04B 10/40; H04B 10/503; H04B 10/58; H04B 10/572; H04B 10/2507;
(Continued)

(56) References Cited

U.S. PATENT DOCUMENTS 8,218,973 B2 * 7/2012 Kagaya .............. H04B 10/2504
398/164
2005/0175312 A1 8/2005 Tanaka et al.
(Continued)

FOREIGN PATENT DOCUMENTS

JP 2005-228766 A 8/2005
JP 2005-286305 A 10/2005
(Continued)

OTHER PUBLICATIONS

An Office Action mailed by the Japanese Patent Office dated Aug. 15, 2017, which corresponds to Japanese Patent Application No. 2014-051965 and is related to U.S. Appl. No. 14/584,457 with Partial English Translation.

*Primary Examiner* — Evelyn A Lester
(74) *Attorney, Agent, or Firm* — Studebaker & Brackett PC

(57) ABSTRACT

A first resistor connected in parallel to a semiconductor optical modulator having first ends, the first resistor and first ends connected to a reference potential. A first end of a first transmission line is connected to second ends of the semiconductor optical modulator and the first resistor. A second transmission line is connected in series to the first transmission line and has an impedance lower than that of the first resistor. A first end of the second transmission line is connected to a second end of the first transmission line. A third transmission line is connected in series to the first and second transmission lines and has an end connected to a second end of the second transmission line, and has an impedance equal to that of the first transmission line. A second resistor and a capacitor are connected in series between the third transmission line and the reference potential.

4 Claims, 11 Drawing Sheets

(51) Int. Cl.

| | | |
|---|---|---|
| *H03H 7/38* | (2006.01) | |
| *G02F 1/03* | (2006.01) | |
| *G02F 1/07* | (2006.01) | |
| *G02F 1/01* | (2006.01) | |
| *G02F 1/015* | (2006.01) | |
| H04B 10/50 | (2013.01) | |
| H04B 1/40 | (2015.01) | |
| H04B 10/516 | (2013.01) | |
| H03H 5/12 | (2006.01) | |
| H04B 10/58 | (2013.01) | |
| H04B 10/25 | (2013.01) | |
| H04L 25/02 | (2006.01) | |
| H04B 10/548 | (2013.01) | |
| H04L 25/10 | (2006.01) | |
| H04B 1/04 | (2006.01) | |
| H03H 7/40 | (2006.01) | |
| H04B 10/40 | (2013.01) | |
| H04B 15/00 | (2006.01) | |
| H04B 10/572 | (2013.01) | |
| H04B 10/556 | (2013.01) | |
| H04B 10/67 | (2013.01) | |
| H04B 10/2507 | (2013.01) | |
| H04B 10/61 | (2013.01) | |
| H03H 11/28 | (2006.01) | |
| H04L 25/03 | (2006.01) | |

(52) U.S. Cl.
CPC ............... *H03H 5/12* (2013.01); *H03H 7/38* (2013.01); *H03H 7/40* (2013.01); *H03H 11/28* (2013.01); *H04B 1/0475* (2013.01); *H04B 1/40* (2013.01); *H04B 10/2504* (2013.01); *H04B 10/2507* (2013.01); *H04B 10/40* (2013.01); *H04B 10/503* (2013.01); *H04B 10/516* (2013.01); *H04B 10/5161* (2013.01); *H04B 10/548* (2013.01); *H04B 10/556* (2013.01); *H04B 10/5563* (2013.01); *H04B 10/572* (2013.01); *H04B 10/58* (2013.01); *H04B 10/6164* (2013.01); *H04B 10/671* (2013.01); *H04B 15/00* (2013.01); *H04L 25/028* (2013.01); *H04L 25/0278* (2013.01); *H04L 25/03343* (2013.01); *H04L 25/10* (2013.01)

(58) Field of Classification Search
CPC .. H04B 10/516; H04B 10/548; H04B 10/556; H04B 10/5563; H04B 10/2504; H04B 10/6164; H04B 10/671; H04B 1/40; H04B 1/0475; H04B 15/00; G02F 1/015; G02F 1/01; G02F 2202/10; H03H 7/38; H03H 7/40; H03H 11/28; H03H 5/12; H04L 25/0278; H04L 25/028; H04L 25/03343; H04L 25/10
USPC ....... 398/136, 175, 176, 180, 187, 192, 194, 398/201; 359/245, 248; 333/124, 17.3, 333/32, 253, 263
See application file for complete search history.

(56) References Cited

U.S. PATENT DOCUMENTS

| | | |
|---|---|---|
| 2005/0194663 A1 | 9/2005 | Ishimura |
| 2006/0008194 A1* | 1/2006 | Kagaya ............... G02F 1/0121 385/1 |
| 2006/0176918 A1 | 8/2006 | Aruga |
| 2007/0195397 A1 | 8/2007 | Okada |
| 2007/0248363 A1 | 10/2007 | Kagaya |
| 2009/0058534 A1 | 3/2009 | Ueno et al. |
| 2009/0123116 A1 | 5/2009 | Tanaka et al. |
| 2010/0232806 A1 | 9/2010 | Kagaya et al. |
| 2012/0269479 A1 | 10/2012 | Okada |

FOREIGN PATENT DOCUMENTS

| | | |
|---|---|---|
| JP | 2006-128545 A | 5/2006 |
| JP | 2006-216839 A | 8/2006 |
| JP | 2007-225904 A | 9/2007 |
| JP | 2007-286454 A | 11/2007 |
| JP | 2009-055550 A | 3/2009 |
| JP | 2009-105157 A | 5/2009 |
| JP | 2010-219716 A | 9/2010 |
| JP | 2012-042866 A | 3/2012 |
| JP | 2012-230176 A | 11/2012 |

\* cited by examiner

SEMICONDUCTOR OPTICAL MODULATION DEVICE

BACKGROUND OF THE INVENTION

Field of the Invention

The present invention relates to a semiconductor optical modulation device including a semiconductor optical modulator modulating an optical signal based on an electrical signal, and in particular to a semiconductor optical modulation device capable of improving the frequency response characteristic.

Background Art

For a semiconductor optical modulation device in which a transmission line part in a metal stem part having a lower impedance is connected to a semiconductor optical modulator and a resistor connected in parallel to each other, and in which a flexible substrate is connected to the transmission line part, adding a line having an impedance lower than a matching impedance to a portion of a transmission line on the flexible substrate for the purpose of limiting the influence of multiple reflection and improving a frequency response characteristic has been proposed (see, for example, Japanese Patent Laid-Open No. 2012-230176). Connecting a series circuit of a resistor and a capacitor between differential signal lines on a flexible substrate for the purpose of improving a frequency response characteristic has also been proposed (see, for example, Japanese Patent Laid-Open No. 2005-286305).

SUMMARY OF THE INVENTION

In the semiconductor optical modulation device disclosed in Japanese Patent Laid-Open No. 2012-230176, however, frequencies at which the frequency response characteristic can be sufficiently improved are limited within a high-frequency region about 10 GHz and the improvement effect is low with respect to frequencies equal to or lower than 5 GHz. In the device disclosed in Japanese Patent Laid-Open No. 2005-286305, the distance between the metal stem and the semiconductor optical element is small and multiple reflection between the semiconductor optical element and the metal stem does not occur at frequencies within the band. Therefore, this device is irrelevant to the present invention that aims to limit the influence of multiple reflection.

In view of the above-described problems, an object of the present invention is to provide a semiconductor optical modulation device capable of improving the frequency response characteristic.

According to the present invention, a semiconductor optical modulation device includes: a semiconductor optical modulator having first and second ends wherein the first end of the semiconductor optical modulator is connected to a reference potential; a first resistor connected in parallel to the semiconductor optical modulator and having first and second ends wherein the first end of the first resistor is connected to the reference potential; a first transmission line having first and second ends wherein the first end of the first transmission line is connected to the second end of the semiconductor optical modulator and to the second end of the first resistor; a second transmission line connected in series to the first transmission line, having first and second ends, and having an impedance lower than a resistance of the first resistor wherein the first end of the second transmission line is connected to the second end of the first transmission line; a third transmission line connected in series to the first and second transmission lines, having an end connected to the second end of the second transmission line, and having an impedance equal to an impedance of the first transmission line; and a second resistor and a capacitor connected in series between the third transmission line and the reference potential.

In the present invention, the second transmission line having a lower impedance is provided between the first and third transmission lines and the series circuit of the second resistor and the capacitor is connected to the third transmission line. The series circuit compensates for the group delay characteristic deviation generated at the second transmission line having a lower impedance. Thus, the frequency response characteristic can be sufficiently improved through a broad frequency range.

Other and further objects, features and advantages of the invention will appear more fully from the following description.

DETAILED DESCRIPTION OF THE PREFERRED EMBODIMENTS

A semiconductor optical modulation device according to the embodiments of the present invention will be described with reference to the drawings. The same components will be denoted by the same symbols, and the repeated description thereof may be omitted.

First Embodiment

Figure 1:
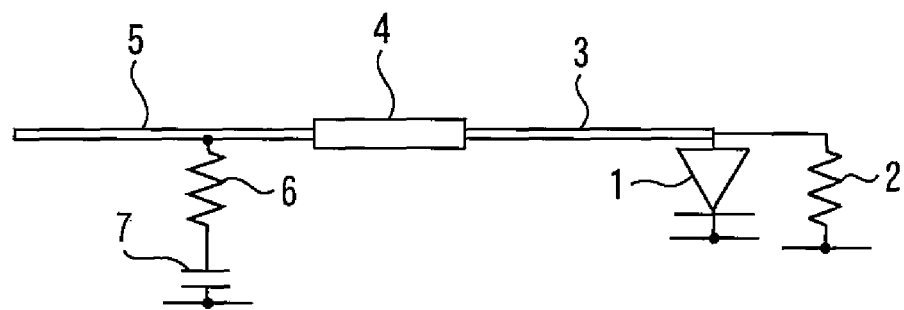
FIG. 1 is a circuit diagram showing a semiconductor optical modulation device according to a first embodiment of the present invention.

FIG. 1 is a circuit diagram showing a semiconductor optical modulation device according to a first embodiment of the present invention. A cathode of a semiconductor optical modulator 1 in the form of a diode is connected to a reference potential. A resistor 2 is connected in parallel to the semiconductor optical modulator 1, and one end of the resistor 2 is connected to the reference potential. One end of a transmission line 3 is connected to an anode of the semiconductor optical modulator 1 and to the other end of the resistor 2.

A transmission line 4 is connected in series to the transmission line 3 by having its one end connected to the other end of the transmission line 3. The transmission line 4 has an impedance lower than that of the resistor 2. A transmission line 5 is connected in series to the transmission lines 3 and 4 by having its one end connected to the other end of the transmission line 4. The transmission line 5 has an impedance equal to that of the transmission line 3. A resistor 6 and a capacitor 7 are connected in series between the transmission line 5 and the reference potential. The resistance value of the resistor 2 and the impedance of the transmission lines 3 and 5 are, for example, 50Ω in the matching system.

If the semiconductor optical modulation device uses a metal stem as a package, a portion passing through glass in the metal stem forms the transmission line 4 having a lower impedance. To mount the semiconductor optical modulator 1 in a temperature controller (thermoelectric cooler), the transmission line 3 is connected between the portion passing through glass and the semiconductor optical modulator 1. The transmission line 5 is provided on a flexible substrate connected to the outside of the package. The series circuit of the resistor 6 and the capacitor 7 is provided as a chip component on the flexible substrate.

The operation of the above-described semiconductor optical modulation device will be described next. The semiconductor optical modulator 1 includes a parasitic component and a resistance component of the capacitor. A parasitic inductance of a wire connecting the semiconductor optical modulator 1 to the transmission line 3 also exists. Multiple reflection therefore occurs.

The resistance value of the resistor 2 and the impedance of the transmission lines 3 and 5 are equal to each other and the impedance of the transmission line 4 is lower. Therefore, multiple reflection also occurs between the semiconductor optical modulator 1 and the transmission line 4.

At a frequency at which equation 1 is established, the phase of a signal produced from one signal by multiple reflection is rotated through 180 degrees when the signal is returned to the semiconductor optical modulator 1 and the signals weaken each other.

$$2 \times L1 \times \sqrt{\in r} = 1/2 \times c/f \qquad \text{(Equation 1)}$$

where L1 represents the length of the transmission line 3; ∈r, a dielectric constant; f, a frequency; and c, the velocity of electricity.

Figure 2:
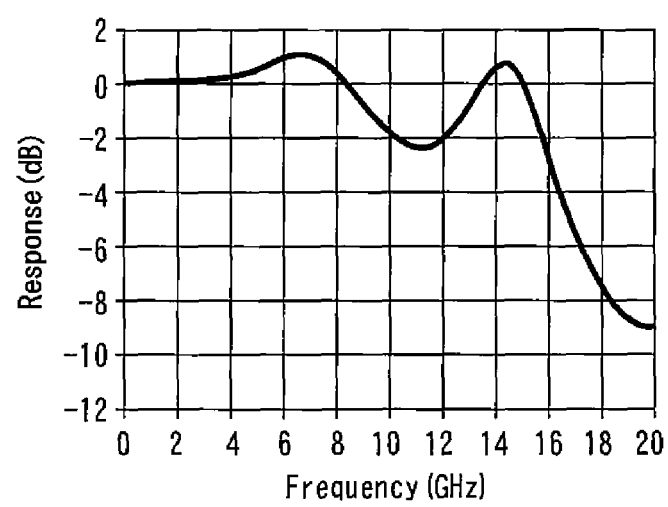
FIG. 2 is a diagram showing a pass characteristic in which an undulation appears.
Figure 3:
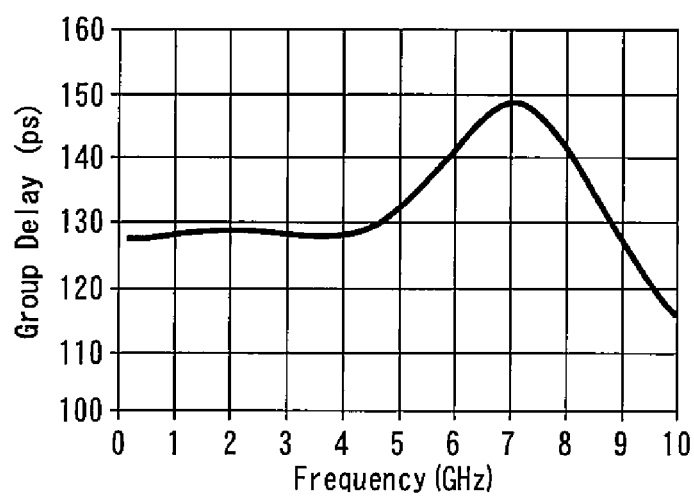
FIG. 3 is a diagram showing a group delay characteristic when an undulation appears.

FIG. 2 is a diagram showing a pass characteristic in which an undulation appears. If L1 is 2.5 mm and ∈r is 9, phase rotation through 180 degrees occurs at 10 GHz. A simulation was performed under this condition from 0.1 to 20 GHz, with the abscissa representing the frequency and the ordinate representing the gain. It can be understood that an undulation appears in the characteristic as shown in FIG. 2. FIG. 3 is a diagram showing a group delay characteristic when an undulation appears. When the undulation shown in FIG. 2 appears in the pass characteristic, a deviation of a group delay characteristic is increased as shown in FIG. 3.

Figure 4:
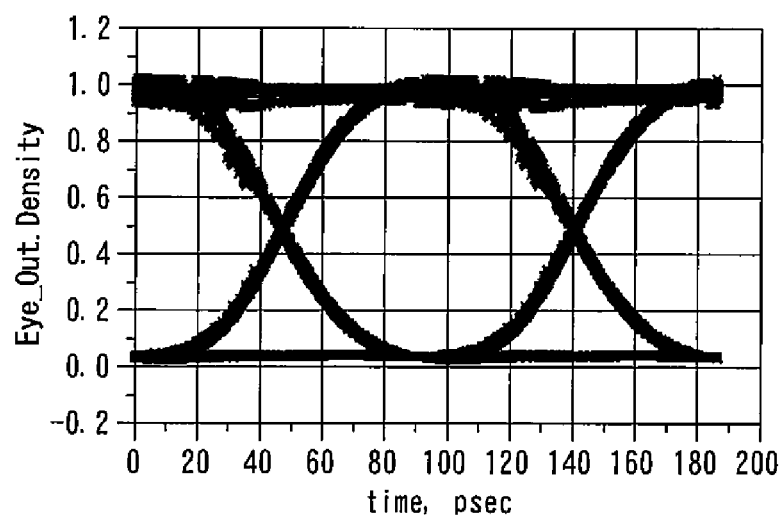
FIG. 4 is a diagram showing an optical output waveform when an undulation appears.

FIG. 4 is a diagram showing an optical output waveform when an undulation appears. In a 10-Gbps optical communication system, a data signal contains frequency components of several kilohertz to 10 GHz. An optical output waveform obtained by converting an electrical signal into an optical signal is a result of superimposition of random signals. If the deviation of the group delay characteristic is increased when the optical output waveform is produced, jitter is increased since the group delay time changes with respect to frequencies.

The series circuit of the resistor 6 and the capacitor 7 connected to the transmission line 5 has an infinitely high impedance and, therefore, does not function with respect to DC. The impedance lowers gradually with increase in frequency. When the impedance of the capacitor is negligibly low, saturation occurs at the resistance value of the resistor 6. If the resistance value of the resistor 6 is R1 and the capacitance of the capacitor 7 is C, the combined impedance Z1 of the series circuit of the resistor 6 and the capacitor 7 is expressed by the following equation:

$$Z1 = R1 + 1/(2j\pi fc) \qquad \text{(Equation 2)}$$

Figure 5:
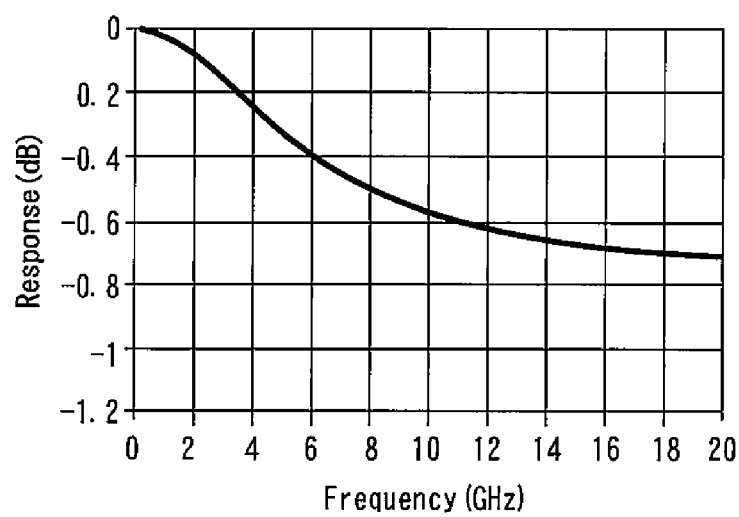
FIG. 5 is a diagram showing the characteristic of the series circuit of the resistor and the capacitor.

FIG. 5 is a diagram showing the characteristic of the series circuit of the resistor and the capacitor. The resistance value of the resistor was set to 220Ω and the capacitance value of the capacitor was set to 0.1 pF.

Figure 6:
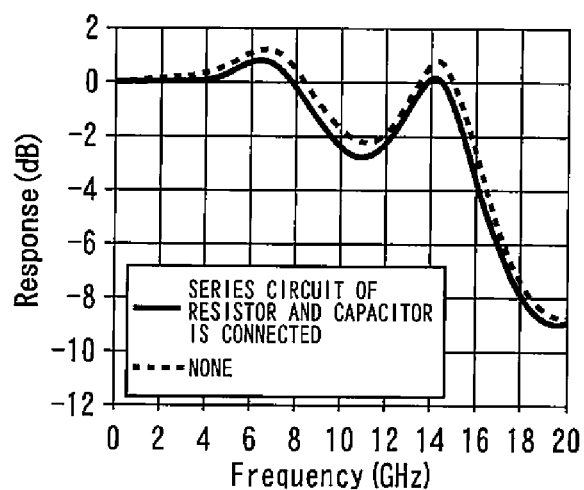
FIG. 6 is a diagram showing a pass characteristic of the semiconductor optical modulation device according to the first embodiment of the present invention.
Figure 7:
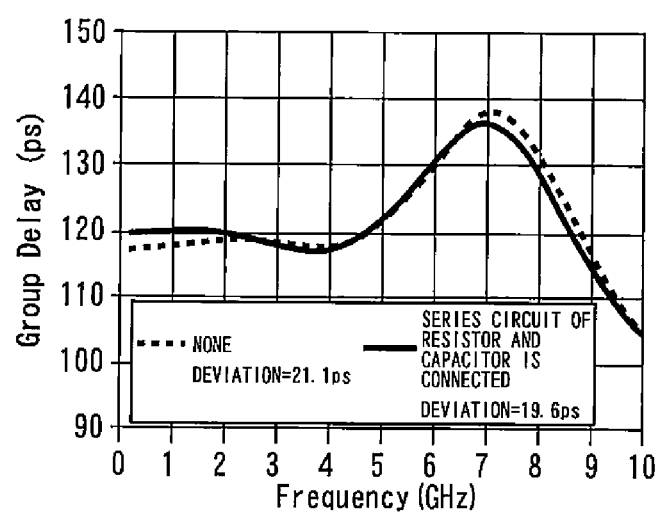
FIG. 7 is a diagram showing a group delay characteristic of the semiconductor optical modulation device according to the first embodiment of the present invention.
Figure 8:
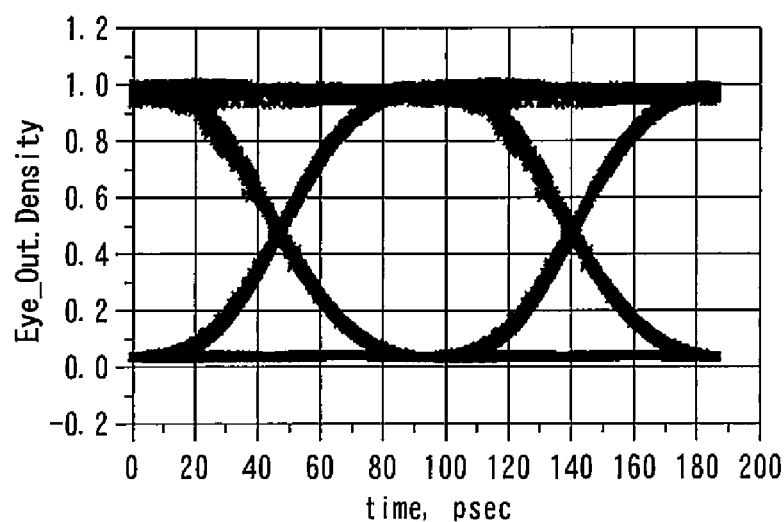
FIG. 8 is a diagram showing an optical output waveform of the semiconductor optical modulation device according to the first embodiment of the present invention.

FIG. 6 is a diagram showing a pass characteristic of the semiconductor optical modulation device according to the first embodiment of the present invention. FIG. 7 is a diagram showing a group delay characteristic of the semiconductor optical modulation device according to the first embodiment of the present invention. FIG. 8 is a diagram showing an optical output waveform of the semiconductor optical modulation device according to the first embodiment of the present invention. An undulation of the gain with respect to frequencies from the vicinity of DC to 10 GHz is made smaller and the deviation of group delay characteristic is also made smaller. It can be understood that the signal-noise (SN) ratio observed as a jitter indicator is improved in the optical output waveform.

In the present embodiment, as described above, the transmission line 4 having a lower impedance is provided between the transmission lines 3 and 5 and the series circuit of the resistor 6 and the capacitor 7 is connected to the transmission line 5. The series circuit compensates for the group delay characteristic deviation generated at the transmission line 4 having a lower impedance. The frequency response characteristic is thereby improved not only in a high-frequency region about 10 GHz but also at low frequencies equal to or lower than 5 GHz. That is, the frequency response characteristic can be sufficiently improved through a broad frequency range.

Figure 9:
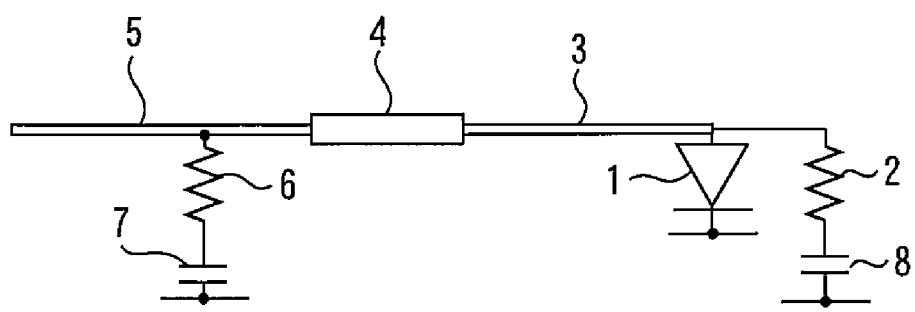
FIG. 9 is a circuit diagram showing a modified example of the semiconductor optical modulation device according to the first embodiment of the present invention.

FIG. 9 is a circuit diagram showing a modified example of the semiconductor optical modulation device according to the first embodiment of the present invention. A capacitor 8 of 1 nF or more is connected between the resistor 2 and the reference potential. Also in this case, the same effect as that of the first embodiment can be obtained.

Even when the impedances of the resistor 2 and the transmission line 3 are not equal to each other, the same effect as that of the first embodiment can also be obtained by adjusting the parameters of the resistor 6 and the capacitor 7. Also, even if the resistor 6 and the capacitor 7 are interchanged in position, the same effect can be obtained.

Second Embodiment

Figure 10:
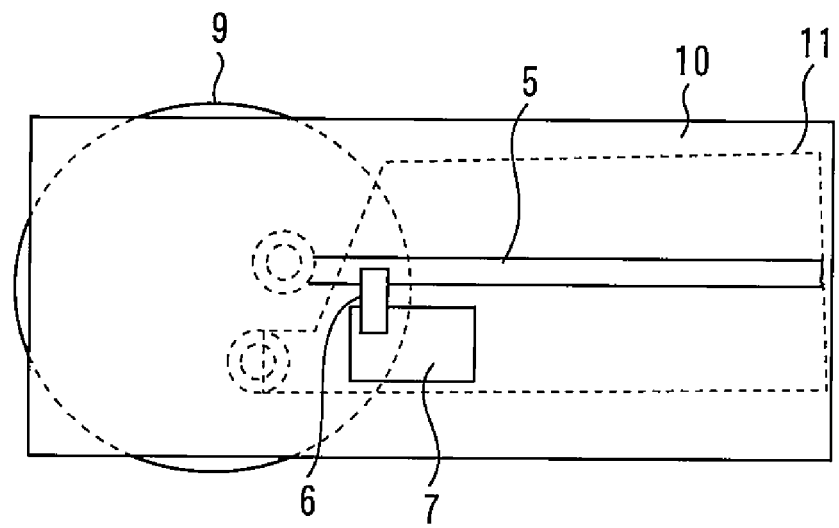
FIG. 10 is a plan view showing a semiconductor optical modulation device according to a second embodiment of the present invention.
Figure 11:
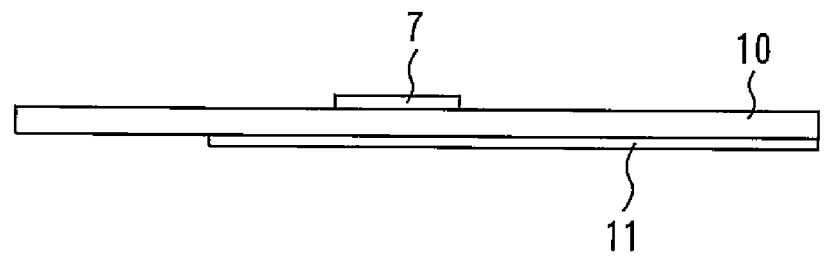
FIG. 11 is a side view of a flexible substrate according to the second embodiment of the present invention.

FIG. 10 is a plan view showing a semiconductor optical modulation device according to a second embodiment of the present invention. FIG. 11 is a side view of a flexible substrate according to the second embodiment of the present invention. The circuit configuration of the semiconductor optical modulation device according to the present embodiment is the same as that shown in FIG. 1.

A flexible substrate 10 is connected to a metal stem 9 in which components including the semiconductor optical modulator 1 are mounted. A base member for the flexible substrate 10 is a dielectric material whose a is about 3 to 5, and the thickness of the base member is about 10 to 50 µm. The transmission line 5 is provided on the flexible substrate 10, and a reference potential wiring pattern 11 having a reference potential is provided on the lower surface of the flexible substrate 10. A microstrip line can be formed by providing a transmission line and a reference potential on upper and lower surfaces of a base member in this way.

The resistor 6 is a chip component provided on the flexible substrate 10, while the capacitor 7 is a wiring pattern provided on the flexible substrate 10. If the size S of the wiring pattern is 500 µm□; the dielectric constant ∈r of the flexible substrate is 4.0; and the thickness t of the flexible substrate is 50 µm, the capacitance value C of the capacitor 7 is expressed by the following equation 3:

$$C = \epsilon \times \epsilon r \times S/d = 0.177 pF \quad \text{(Equation 3)}$$

In the present embodiment, as described above, the capacitor 7 is a wiring pattern provided on the flexible substrate 10. The capacitor 7 can be formed by a wiring pattern of a size generally equal to that of a chip component. Therefore, the number of chip components can be reduced and the device can be constructed at a low price.

Third Embodiment

An example of use of the transmission line 5 provided on the flexible substrate 10, a chip component provided as resistor 6 on the flexible substrate 10 and a wiring pattern provided as capacitor 7 on the flexible substrate 10 has been described in the description of the second embodiment. In the present embodiment, a dielectric substrate is used in place of the flexible substrate 10 and a thin-film resistor provided as resistor 6 on the dielectric substrate and a wiring pattern provided as capacitor 7 on the dielectric substrate are used. The wiring pattern may be formed in comb teeth form instead of being formed in rectangular form as shown in FIG. 10.

A resistor and a capacitor can thus be constructed on one dielectric substrate at a low price. Also, if the capacitor 7 is provided in comb teeth form, a length of the capacitor 7 closer to that of the reference potential wiring pattern 11 can be secured and the capacitor can be constructed while saving space.

Fourth Embodiment

Figure 12:
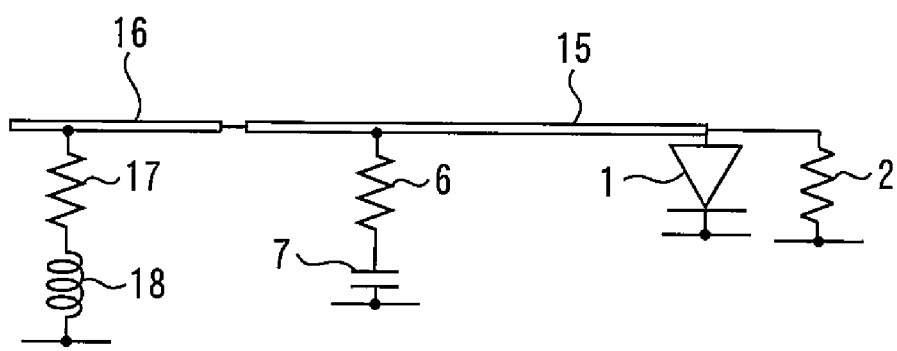
FIG. 12 is a circuit diagram showing a semiconductor optical modulation device according to a fourth embodiment of the present invention.

FIG. 12 is a circuit diagram showing a semiconductor optical modulation device according to a fourth embodiment of the present invention. One end of the semiconductor optical modulator 1 is connected to a reference potential. The resistor 2 is connected in parallel to the semiconductor optical modulator 1, and one end of the resistor 2 is connected to the reference potential. One end of a transmission line 15 is connected to the other end of the semiconductor optical modulator 1 and to the other end of the resistor 2. The resistor 6 and the capacitor 7 are connected in series between the transmission line 15 and the reference potential. A transmission line 16 is connected in series to the transmission line 15 by having its one end connected to the other end of the transmission line 15. A resistor 17 and an inductor 18 are connected in series between the transmission line 16 and the reference potential.

If the resistance value of the resistor 17 is R2 and the inductance of the inductor 18 is L, the combined impedance Z2 of the series circuit of the resistor 17 and the inductor 18 is expressed by the following equation 4:

$$Z2 = R2 + 2j\pi fL \quad \text{(Equation 4)}$$

At a low frequency, Z2 is substantially equal to the resistance value R2 since the inductance L term is negligible. With increase in frequency, the impedance of the inductance L term becomes higher. Since this series circuit is connected in parallel with the resistor 2, the gain in the pass characteristic is reduced at a low frequency and is increased at a high frequency.

Figure 13:
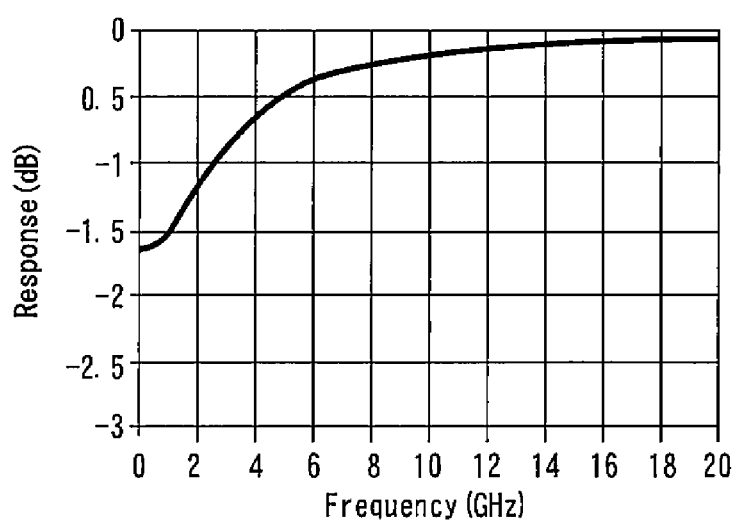
FIG. 13 is a diagram showing a frequency response characteristic of a series circuit of a resistor and an inductor.
Figure 14:
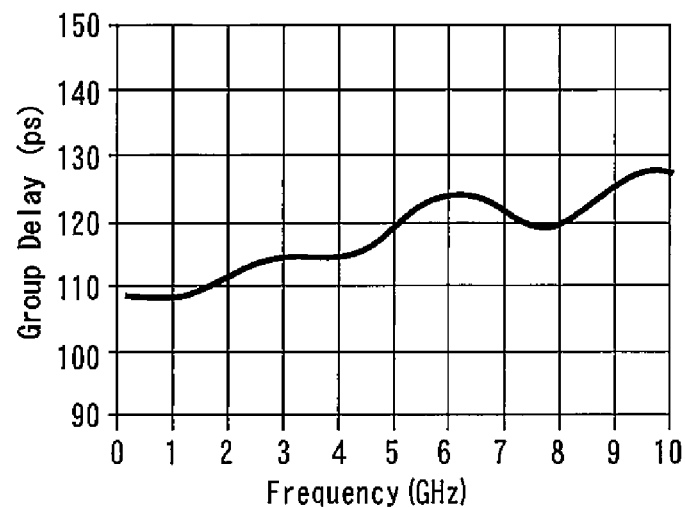
FIG. 14 is a diagram showing a group delay characteristic when the series circuit of the resistor and the inductor is provided but no series circuit of a resistor and a capacitor is provided.
Figure 15:
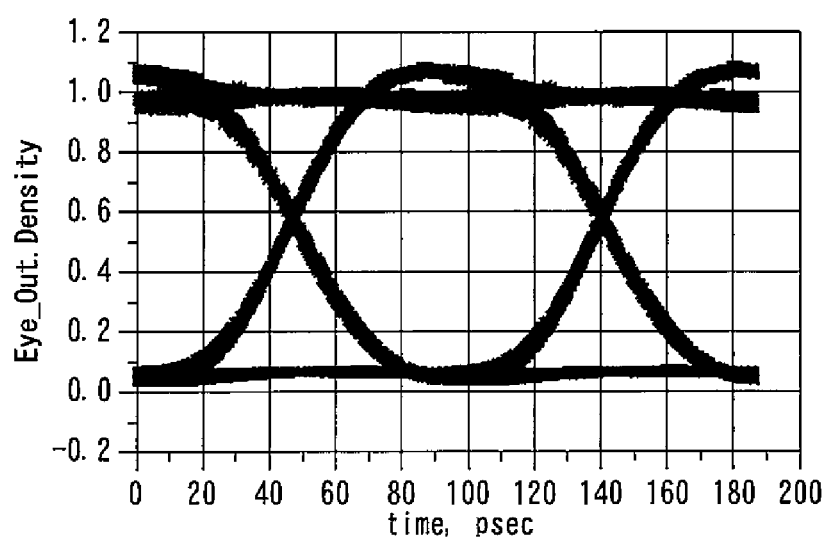
FIG. 15 is a diagram showing an optical output waveform when the series circuit of the resistor and the inductor is provided but no series circuit of a resistor and a capacitor is provided.

FIG. 13 is a diagram showing a frequency response characteristic of a series circuit of a resistor and an inductor. The resistance value of the resistor was set to 120Ω and the inductance value of the inductor was set to 6.8 nH. FIG. 14 is a diagram showing a group delay characteristic when the series circuit of the resistor and the inductor is provided but no series circuit of a resistor and a capacitor is provided. FIG. 15 is a diagram showing an optical output waveform when the series circuit of the resistor and the inductor is provided but no series circuit of a resistor and a capacitor is provided. In the case of combination with a narrow-band semiconductor optical modulation device, the gain is increased at a high frequency and an improvement effect is obtained. In the case of combination with a wide-band semiconductor optical modulation device, excessive compensation is made, the group delay deviation is increased and the quality of the optical output waveform degrades.

Figure 16:
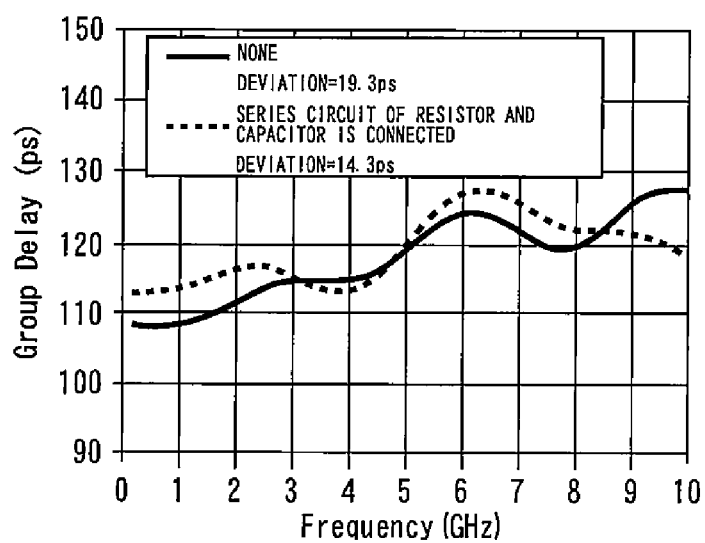
FIG. 16 is a diagram showing a frequency response characteristic of the semiconductor optical modulation device according to the fourth embodiment of the present invention.
Figure 17:
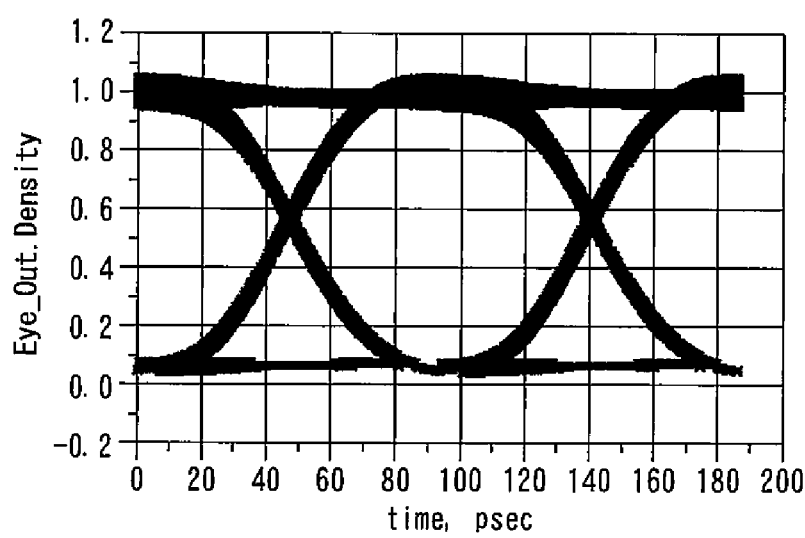
FIG. 17 is a diagram showing an optical output waveform of the semiconductor optical modulation device according to the fourth embodiment of the present invention.

On the other hand, the characteristic of a series circuit of a resistor and the capacitor is as shown in FIG. 5. In the present embodiment, therefore, the series circuit of the resistor 6 and the capacitor 7 and the series circuit of the resistor 17 and the inductor 18 are combined. FIG. 16 is a diagram showing a frequency response characteristic of the semiconductor optical modulation device according to the fourth embodiment of the present invention. FIG. 17 is a diagram showing an optical output waveform of the semiconductor optical modulation device according to the fourth embodiment of the present invention. The resistance value of the resistor 17 was set to 200Ω; the inductance value of the inductor 18, to 6.8 nH; the resistance value of the resistor 6, to 120Ω; and the capacitance value of the capacitor 7, to 0.2 pF. From these diagrams, it can be understood that the frequency response characteristic can be sufficiently improved through a broad frequency range in the present embodiment.

Figure 18:
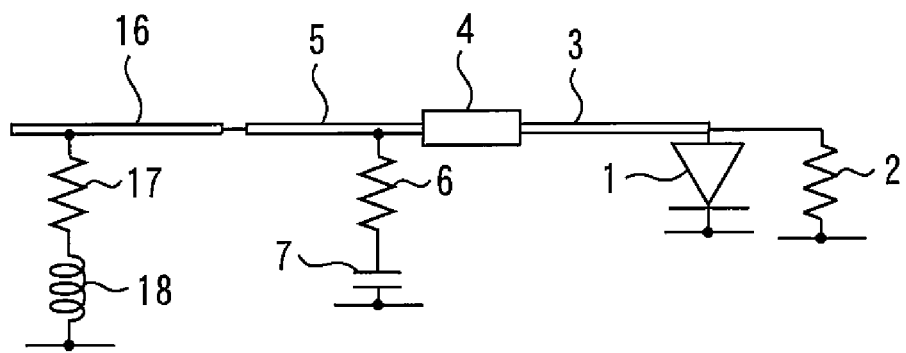
FIG. 18 is a circuit diagram showing a modified example of the semiconductor optical modulation device according to the fourth embodiment of the present invention.

FIG. 18 is a circuit diagram showing a modified example of the semiconductor optical modulation device according to the fourth embodiment of the present invention. The transmission line 16, the resistor 17 and the inductor 18 are added to the same semiconductor optical modulation device as that in the first embodiment. As a result, even if an impedance mismatching occurs in some place on the transmission line, the same effect can be obtained by optimizing the constants of the series circuit of the resistor 6 and the capacitor 7. The resistor 6 and the capacitor 7 may be interchanged in position, and the resistor 17 and the inductor 18 may be interchanged in position.

Fifth Embodiment

Figure 19:
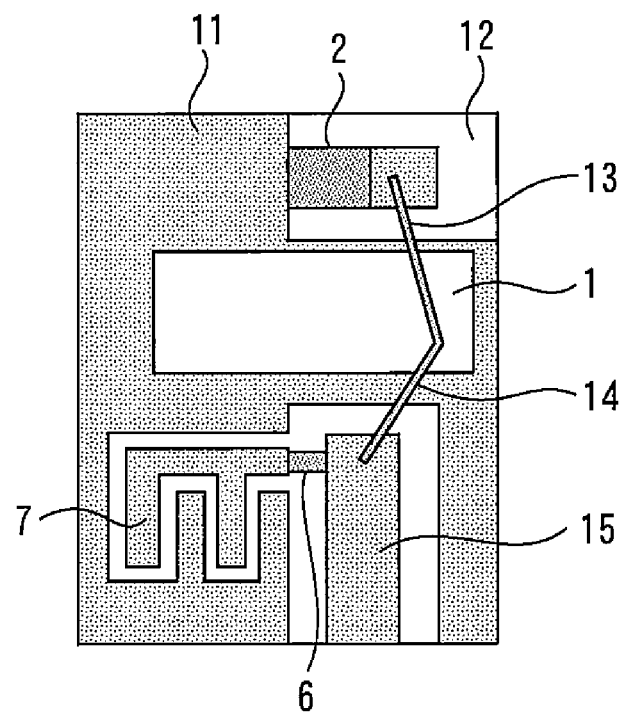
FIG. 19 is a plan view showing a semiconductor optical modulation device according to a fifth embodiment of the present invention.

FIG. 19 is a plan view showing a semiconductor optical modulation device according to a fifth embodiment of the present invention. The circuit configuration of the semiconductor optical modulation device according to the present embodiment is the same as that shown in FIG. 12. The semiconductor optical modulator 1, the resistors 2 and 6, the transmission line 15, the capacitor 7 and a reference potential wiring pattern 11 having a reference potential are provided on a dielectric substrate 12. The semiconductor optical modulator 1 is connected to the resistor 2 and to the transmission line 15 by wires 13, and 14, respectively. The resistors 2 and 6 are thin-film resistors provided on the dielectric substrate 12. The capacitor 7 is a wiring pattern in comb teeth form provided on the dielectric substrate 12 by being set in the vicinity of the reference potential wiring pattern 11. The transmission line 16, the resistor 17 and the inductor 18 connected to the transmission line 15 are not illustrated.

In the present embodiment, the resistors 2 and 6 are thin-film resistors provided on the dielectric substrate 12, while the capacitor 7 is a wiring pattern provided on the dielectric substrate 12. The resistor and the capacitor can thus be constructed on one dielectric substrate 12 at a low price. Also, if the capacitor 7 is provided in comb teeth form, a length of the capacitor 7 closer to that of the reference potential wiring pattern 11 can be secured and the capacitor can be constructed while saving space.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-051965, filed on Mar. 14, 2014 including specification, claims, drawings and summary, on which the Convention priority of the present application is based, is incorporated herein by reference in its entirety.

What is claimed is:

1. A semiconductor optical modulation device comprising:
a semiconductor optical modulator having first and second ends wherein the first end of the semiconductor optical modulator is connected to a reference potential;
a first resistor connected in parallel to the semiconductor optical modulator and having first and second ends wherein the first end of the first resistor is connected to the reference potential;
a first transmission line having first and second ends wherein the first end of the first transmission line is connected to the second end of the semiconductor optical modulator and to the second end of the first resistor;
a second transmission line connected in series to the first transmission line, having first and second ends, and having an impedance lower than a resistance of the first resistor wherein the first end of the second transmission line is connected to the second end of the first transmission line;
a third transmission line provided on a flexible substrate and connected in series to the first and second transmission lines, having an end connected to the second end of the second transmission line, and having an impedance equal to an impedance of the first transmission line;
a second resistor and a capacitor connected in series between the third transmission line and the reference potential;
the second resistor is a chip component provided on the flexible substrate; and
the capacitor is a wiring pattern provided on the flexible substrate.

2. A semiconductor optical modulation device comprising:
a semiconductor optical modulator having first and second ends wherein the first end of the semiconductor optical modulator is connected to a reference potential;
a first resistor connected in parallel to the semiconductor optical modulator and having first and second ends wherein the first end of the first resistor is connected to the reference potential;
a first transmission line having first and second ends wherein the first end of the first transmission line is connected to the second end of the semiconductor optical modulator and to the second end of the first resistor;
a second transmission line connected in series to the first transmission line, having first and second ends, and having an impedance lower than a resistance of the first resistor wherein the first end of the second transmission line is connected to the second end of the first transmission line;
a third transmission line provided on a dielectric substrate and connected in series to the first and second transmission lines, having an end connected to the second end of the second transmission line, and having an impedance equal to an impedance of the first transmission line;
a second resistor and a capacitor connected in series between the third transmission line and the reference potential;
the second resistor is a thin-film resistor provided on the dielectric substrate; and
the capacitor is a wiring pattern provided on the dielectric substrate.

3. A semiconductor optical modulation device comprising:
a semiconductor optical modulator having first and second ends wherein the first end of the semiconductor optical modulator is connected to a reference potential;
a first resistor connected in parallel to the semiconductor optical modulator and having first and second ends wherein the first end of the first resistor is connected to the reference potential;
a first transmission line having first and second ends wherein the first end of the first transmission line is connected to the second end of the semiconductor optical modulator and to the second end of the first resistor;

a second resistor and a capacitor connected in series between the first transmission line and the reference potential;

a second transmission line connected in series to the first transmission line and having an end connected to the second end of the first transmission line; and a third resistor and an inductor connected in series between the second transmission line and the reference potential.

4. The semiconductor optical modulation device according to claim 3, wherein the first transmission line is provided on a dielectric substrate, the first and second resistors are thin-film resistors provided on the dielectric substrate, and the capacitor is a wiring pattern provided on the dielectric substrate.

* * * * *